(12) United States Patent
Åström et al.

(10) Patent No.: US 10,368,217 B2
(45) Date of Patent: Jul. 30, 2019

(54) GENERATING A MODEL FOR POSITIONING

(71) Applicant: Combain Mobile AB, Lund (SE)

(72) Inventors: Karl Erik Åström, Lund (SE); Simon Emil Sten Burgess, Rinkaby (SE); Sven Rasmus Ljungberg, Lund (SE); Björn Martin Gunnar Lindquist, Bjärred (SE)

(73) Assignee: COMBAIN MOBILE AB, Lund (SE)

( * ) Notice: Subject to any disclaimer, the term of this patent is extended or adjusted under 35 U.S.C. 154(b) by 0 days.

(21) Appl. No.: 15/952,125

(22) Filed: Apr. 12, 2018

(65) Prior Publication Data

US 2018/0234820 A1     Aug. 16, 2018

Related U.S. Application Data

(63) Continuation of application No. 15/487,307, filed on Apr. 13, 2017, now abandoned, which is a (Continued)

(30) Foreign Application Priority Data

May 13, 2015    (EP) .................................... 15167557

(51) Int. Cl.
*H04W 24/00*     (2009.01)
*H04W 4/33*     (2018.01)
(Continued)

(52) U.S. Cl.
CPC ............. *H04W 4/33* (2018.02); *G01S 5/0242* (2013.01); *G01S 5/0252* (2013.01); *G01S 5/06* (2013.01);
(Continued)

(58) Field of Classification Search
USPC ........................................ 455/446, 63.2, 418
See application file for complete search history.

(56) References Cited

U.S. PATENT DOCUMENTS 7,047,014 B1 * 5/2006 Friday ................... H04W 16/18
345/581
8,077,090 B1    12/2011 Chintalapudi et al.
(Continued)

FOREIGN PATENT DOCUMENTS

GB         2460406 A     12/2009
WO    WO 2010/059934     5/2010

OTHER PUBLICATIONS

Extended European Search Report dated Nov. 12, 2015 in corresponding European Application No. 15167557.6.
(Continued)

*Primary Examiner* — David Q Nguyen
(74) *Attorney, Agent, or Firm* — Knobbe Martens Olson & Bear, LLP

(57) ABSTRACT

A method for generating a model of an environment enabling positioning within the environment is disclosed. The method comprises: receiving distance-dependent measurements relating to a distance between a receiving unit position and a source position; receiving information relating to geographic positions, each defining a receiving unit position or a source position; forming a candidate model, which defines candidate source positions and candidate receiving unit positions; iteratively reducing a model error of said candidate model, wherein said model error comprises a weighted contribution from distance-dependent errors, which are based on a difference between a distance-dependent value between a candidate source position and a candidate receiving unit position and the corresponding distance-dependent measurement, and geographic position errors, which are based on a difference between a geographic
(Continued)

position and a corresponding candidate position, and outputting, from said iterative reducing, determined locations for said plurality of sources to form said model of the environment.

18 Claims, 3 Drawing Sheets

Related U.S. Application Data continuation of application No. 15/153,456, filed on May 12, 2016, now Pat. No. 9,648,466.

(51) Int. Cl.
    *G01S 5/02*     (2010.01)
    *G01S 5/06*     (2006.01)
    *G06F 17/50*     (2006.01)
    *H04W 4/04*     (2009.01)
    *H04B 17/318*     (2015.01)

(52) U.S. Cl.
    CPC ............ *G06F 17/509* (2013.01); *H04W 4/04* (2013.01); *G01S 5/0284* (2013.01); *H04B 17/318* (2015.01)

(56) References Cited

U.S. PATENT DOCUMENTS

| | | | |
|---|---|---|---|
| 2005/0285792 A1 | 12/2005 | Sugar et al. | |
| 2008/0042898 A1* | 2/2008 | Sharma | G01S 5/0284 342/450 |
| 2014/0106773 A1* | 4/2014 | Li | H04W 4/043 455/456.1 |
| 2014/0120947 A1* | 5/2014 | Siomina | G01S 5/0221 455/456.1 |
| 2014/0122040 A1 | 5/2014 | Marti | |
| 2014/0200037 A1 | 7/2014 | Venkatraman et al. | |
| 2014/0274119 A1* | 9/2014 | Venkatraman | H04W 4/043 455/456.1 |

OTHER PUBLICATIONS

Chintalapudi et al., "Indoor Localization without the Pain," *MobiCom* '10, Sep. 20-24, 2010; Chicago, Illinois, USA; in 12 pages.
European Search Report dated May 16, 2018 corresponding to European Application No. EP 17211019.9.

* cited by examiner

GENERATING A MODEL FOR POSITIONING

INCORPORATION BY REFERENCE TO ANY PRIORITY APPLICATIONS

This application is a continuation of U.S. patent application Ser. No. 15/487,307, filed Apr. 13, 2017, which is a continuation of U.S. patent application Ser. No. 15/153,456, filed May 12, 2016, which claims priority under 35 USC 119 to European Application No. 15167557.6, filed May 13, 2015, in the European Patent Office (EPO), the disclosures of which are incorporated by reference herein in their entireties.

BACKGROUND

Field

The described technology relates, in general, to a system and method for creating a model, which may be used for localizing devices in an environment, in particular, an indoor environment.

Description of the Related Art

A positioning system enables a mobile device to determine its position, and makes the position of the device available for position-based services such as navigating, tracking or monitoring, etc. Global Navigation Satellite System (GNSS), such as the Global Positioning System (GPS), is the most widely used positioning system and used in various devices such as smart phones, tracking equipment, etc. While providing very good and accurate outdoor location, there are some drawbacks with GPS. For small and low cost battery operated electronic devices, GPS is too expensive and draws too much power. GPS also cannot be deployed for indoor use, because the required close to line-of-sight transmission between receivers and satellites is not possible in an indoor environment.

SUMMARY OF CERTAIN INVENTIVE ASPECTS

It is an object of the described technology to enable a simple and robust method and system for generating a model of an environment enabling positioning within the environment. It is a further object of the described technology to generate a model which allows accurate determination of locations of receiving units in the environment.

According to a first aspect, there is provided a method for generating a model of an environment enabling positioning within the environment, said method comprising: receiving a plurality of distance-dependent measurements from one or more receiving units, each of said distance-dependent measurements providing information relating to a distance between a receiving unit position of the one or more receiving units and a source position and said plurality of distance-dependent measurements providing information relating to distances between receiving unit positions and source positions for a plurality of sources; receiving information relating to a plurality of geographic positions, each of said geographic positions defining a receiving unit position or a source position; forming a candidate model, which defines candidate source positions for said plurality of source positions and candidate receiving unit positions for said plurality of receiving unit positions; iteratively reducing a model error of said candidate model, wherein said model error comprises a weighted contribution from distance-dependent errors, which are based on a difference between a distance-dependent value between a candidate source position and a candidate receiving unit position and the distance-dependent measurement related to the distance between the receiving unit position and the source position, and geographic position errors, which are based on a difference between a geographic position and a candidate position for the receiving unit position or source position, and outputting, from said iterative reducing, determined locations for said plurality of sources to form said model of the environment.

According to a second aspect, there is provided a system for generating a model of an environment enabling positioning within the environment, said system comprising: a processing unit, said processing unit being arranged to receive a plurality of distance-dependent measurements from one or more receiving units, each of said distance-dependent measurements providing information relating to a distance between a receiving unit position of the one or more receiving units and a source position and said plurality of distance-dependent measurements providing information relating to distances between receiving unit positions and source positions for a plurality of sources, said processing unit being further arranged to receive information relating to a plurality of geographic positions, each of said geographic positions defining a receiving unit position or a source position; wherein said processing unit comprises a model calculating unit, which is arranged to receive said plurality of distance-dependent measurements and said information relating to a plurality of geographic positions as input, wherein the model calculating unit is configured to: form a candidate model, which defines candidate source positions for said plurality of source positions and candidate receiving unit positions for said plurality of receiving unit positions; iteratively reduce a model error of said candidate model, wherein said model error comprises a weighted contribution from distance-dependent errors, which are based on a difference between a distance-dependent value between a candidate source position and a candidate receiving unit position and the distance-dependent measurement related to the distance between the receiving unit position and the source position, and geographic position errors, which are based on a difference between a geographic position and a candidate position for the receiving unit position or source position, and output, from said iterative reducing, determined locations for said plurality of sources to form said model of the environment.

According to the described technology, a method and system is provided, wherein a model of an environment can be generated without requiring pre-deployment efforts, such as building detailed RF maps for fingerprinting or adding building maps. Rather, by means of gathering a plurality of distance-dependent measurements, sufficient amounts of information may be gathered allowing a model of the environment to be computed. Thus, the model may be generated based on measurements that may be received from receiving units, such as mobile phones of users, over a period of time. The model may therefore be generated by collecting measurements that are anyway made by the mobile phones and there is no requirement on efforts by users or a deployer of the system.

Further, according to the described technology, a self-improving model is facilitated. The model may be continuously or periodically re-generated based on further distance-dependent measurements that may be received, e.g., when positioning devices after the model has been launched.

Since information relating to a plurality of geographic positions is received, the model may provide localization globally by means of the geographic positions relating relative positions determined by the distance-dependent measurements to a global positioning system. A plurality of geographic positions may also contribute to a scale to the model. It should be realized that it is sufficient to receive information relating to geographic positions defining a few of the receiving unit positions or source positions and it is certainly not necessary to receive information relating to geographic positions or all or even a majority of the receiving unit positions or source positions.

Further, the generated model may be used also for positioning of simple wireless devices. It may be advantageous to use advanced mobile devices, such as mobile phones, to gather the necessary information for generating the model. However, once the model has been generated, a location may be quickly determined based on the model, and the localization may even be performed by a simple wireless device. Thus the system can use existing infrastructure in buildings, such as Wi-Fi APs or Bluetooth beacons, and be able to position low cost wireless devices, such as Wi-Fi receivers or Bluetooth receivers, with no extra hardware added.

Although the described technology is mainly described for indoor environments, it is to be understood that the method and system also works outdoor. It may for instance be of use for devices that cannot use GPS or similar techniques.

It is further an insight of the described technology that labeling any information as completely correct makes the model sensitive to errors in such presumably correct information. Rather, according to the described technology, all information received as input for generating the model is treated as at least partly uncertain and such uncertainty is accounted for when generating the model. In particular, information relating to geographic positions may be received in several different manners, which may generally be quite reliable. However, according to the described technology, the model is generated by viewing the geographic positions as potentially incorrect and it is possible to generate a model wherein the model does not place the geographic position exactly according to the received information. This implies that the generated model is particularly robust.

As used herein, the term "distance-dependent measurement" should be construed as a measurement that gives some indication of a distance, even though it may not measure the distance directly. Rather, the measured quantity may be a quantity that is dependent on distance in some way. The measured quantity need not even be directly proportional to the distance and may even be non-linearly related to the distance. As further described below, the distance measurement may e.g. be based on a received power of a signal, i.e. a signal strength, or be based on a time of travel of a signal between a source and a receiving unit. Also, for the use of the distance-dependent measurement in determining of distance-dependent errors, a non-linear scale, such as a logarithmic scale, may be used. Thus, the distance-dependent measurement may e.g. be a logarithmic value of a distance-dependent quantity. This also implies that for small distances, an error in distance will have large effect.

The model of the environment may define the environment from the point of view of the type of information that is gathered to generate the model. Thus, where RF signals are used for distance-dependent measurements, the model of the environment represents RF signals that are emitted by the plurality of sources.

The sources may be any type of device that transmits a signal that may be received by a receiving unit. It may be particularly advantageous to use sources that are already in extensive used and placed in the environment to be modeled. In this regard, sources may therefore be Wi-Fi access points or Bluetooth beacons that are already frequently used. Of course, several different types of sources may be simultaneously used as input to the model. Also, base stations, such as Long-Term Evolution (LTE) pico base stations may constitute sources.

According to an embodiment, the plurality of sources comprise a source which is arranged to continuously transmit a radio-frequency signal allowing receiving units to discover the source. Thus, the source always provides a signal which may be picked up the receiving units.

The receiving unit may any type of device that is able to receive a signal transmitted by the source. It could be a mobile phone, a computer, such as a laptop, or other processing devices. However, it may also be a simple device having a receiver. With the dawning of Internet of Things, it may be contemplated that such a receiver may be installed in any type of device, such as TVs, lighting devices, surveillance systems, or domestic appliances.

It should be realized that the information relating to a geographic position may be received in many different ways. For instance, it may be a measurement of a GPS position for the receiving unit or the source. However, the geographic position may alternatively be received from a database providing information of positions of sources, e.g. obtained when installing the sources. As another alternative, the information relating to geographic positions may be received by means of a user indicating the positions of sources and/or receiving units on a map of the environment. The information relating to a geographic position may be provided as location coordinates providing a longitude and latitude value, but the information may alternatively be provided in relation to a map or another coordinate system.

According to an embodiment, a receiving unit is arranged to determine a geographic position, and receiving information relating to a plurality of geographic position measurements may comprise receiving a geographic position measurement from the receiving unit defining a geographic position for the receiving unit position. Receiving units, such as mobile phones, may have the capacity to determine geographic positions, e.g. through a GPS signal. Thus, such receiving units may be well equipped to provide information relating to geographic positions in the form of geographic position measurements.

It should also be realized that the weights given to the contribution of distance-dependent errors and geographic position errors may differ not only between the different types of errors, but also for different errors of the same type. The weights may be based on how reliable the information is that is weighted. For instance, a geographic position may often be more reliable than the distance-dependent measurements and therefore geographic position errors may generally be given a higher weight. Further, information regarding the accuracy of a distance-dependent measurement or a geographic position may be gathered and such accuracy information may then be used for providing an appropriate weight to the related error. In particular, it may be possible to receive information regarding accuracy of GPS measurements.

The iterative reducing of a model error may be performed until an optimization of the model error is received. However, it may not be necessary to perform optimization until a global or local minimum of the model error is reached. In an alternative, the iterative reducing may for instance be performed until a model error is reached which is below a desired threshold.

The iterative reducing may be started from qualified guesses of candidate source positions and candidate receiving unit positions. By means of making a good guess, the iterative reducing may quickly reach an optimization of the model. Also, minimization of the model error to a local minimum instead of to a global minimum may be avoided. It should also be realized that several different set-ups of start values may be used and tested in order to find the best model.

The method for generating a model may require extensive computing power in order to be able to handle huge volumes of data and to compute a model based on these volumes of data. Hence, the method may be performed by a server, which is arranged to receive information from receiving units. However, once a model has been generated, extensive computing power is not necessary for determining locations based e.g. on measured signal strengths within the environment. Thus, the model may be downloaded to receiving units and may thereafter be used therein for the determining of locations of the receiving units.

According to an embodiment, the distance-dependent measurements comprise power-based distance measurements which represent a distance as a measured power of a signal received by the receiving unit and emitted by the source. Using power-based distance measurements, such as RSS measurements, allows the method for generating a model to use available receiving units, such as mobile phones, which may provide such measurements without any need for setting up the receiving unit.

The measured power of the signal is dependent on a damping factor in the environment. In an embodiment, the candidate model further comprises at least one candidate damping factor and said iterative reducing comprises varying the at least one damping factor in order to reduce the model error. This implies that the method may also take into account the damping factor in the environment in order to generate the model. Thus, more information may need to be gathered in order to provide a reliable result from the model. However, the generated model may also be even more accurately representing the environment.

The measured power of the signal is also dependent on an emitted power of the source. In an embodiment, the candidate model further comprises at least one candidate emitted power for said plurality of sources, and said iterative reducing comprises varying the at least one candidate emitted power in order to reduce the model error. Often sources may be manufactured to emit signals with a specific power and if all sources in the environment emit using the same power, using candidate emitted powers may not substantially change the resulting model. However, if some sources emit weaker or stronger signals, providing candidate emitted powers may generate a more accurate model of the environment.

According to an embodiment, the method generates a two-dimensional (2D) model of the environment. This implies that two-dimensional coordinates of locations may be provided, but a height of a position may not be provided by the model. Such a model may provide positioning for a specific floor of a building or may be suitable for one-floor buildings. In another embodiment, the method generates a partly limited three-dimensional model of the environment. For instance, the generated model may allow determination of which floor of a building that a position relates to, which implies that only discrete values of a height direction are allowed. This may be called a 2.5-dimensional model. In yet another embodiment, the method generates a three-dimensional (3D) model of the environment.

According to an embodiment, the distance-dependent measurements comprise time-based distance measurements which represent a distance as a measured round-trip time of a signal exchanged between the receiving unit and the source. Time-based distance measurements may be available, at least within a near future, in standard mobile phones. It should be realized that time-based distance measurements may be solely used or may be used in combination with power-based distance measurements. The time-based distance measurements may be more reliable than power-based distance measurements and corresponding weights may be given in the iterative reducing.

According to an embodiment, the iterative reducing uses only time-based distance measurements and the method further comprises associating information representing properties of emitted signals in the environment with the determined locations for said plurality of sources in said model. Having determined locations for the plurality of sources based on time-based distance measurements, the power-based measurements may be added to the model for determining e.g. properties of the building. The power-based measurements may thus determine positions of doors, walls, or windows in the building.

According to an embodiment, the iterative reducing comprises calculating derivatives for the distance-dependent errors and the geographic position errors and using the derivatives to update the candidate model in order to reduce the model error. During generation of the model, a direction for changing the model may be determined such that the model error may be reduced. By means of calculating derivatives for the errors, such direction for changing the model may be obtained.

According to an embodiment, the distance-dependent measurements comprise sequential distance-dependent measurements for sequential receiving unit positions, said sequential distance-dependent measurements being recorded in sequence during movement of a receiving unit, and wherein said model error comprises a weighted contribution from sequence errors, which are based on a difference between relations of candidate positions for the sequential receiving unit positions to each other and a pre-determined expectation of relations of the sequential receiving unit positions. A plurality of distance-dependent measurements may easily be obtained while a person is moving through the environment carrying the receiving unit. By knowing that a number of distance-dependent measurements are sequential distance-dependent measurements, sequence errors may be set up in the generation of the model for improving the resulting model. For instance, it may be assumed that the person moves at a constant pace through the environment, which means that a sequence error may be provided if the candidate positions are not at equal distance from each other.

According to an embodiment, the method further comprises receiving further distance-dependent measurements from one or more receiving units, each of said further distance-dependent measurements providing information relating to distances between a receiving unit position of the one or more receiving units and source positions of said plurality of sources, and improving said model of the environment based on the further distance-dependent measurements. The further distance-dependent measurements may easily be added to the information that has been used for generating the model in order to improve the model. This implies that the model may be continuously improved while it is being used. Such continuous improvement is not possible when using positioning techniques that need an offline training phase.

According to a third aspect, there is provided a computer program product comprising a computer-readable medium with computer-readable instructions such that when executed on a processing unit the computer program product will cause the processing unit to perform the method according to the first aspect. Such a computer program product may thus provide a possibility to install and execute the program in order to obtain the above-discussed advantages of the method.

According to a fourth aspect, there is provided a method for determining a location of a receiving unit, said method comprising: measuring distance-dependent values of the receiving unit in relation to a plurality of sources, retrieving locations of said plurality of sources, wherein said locations have been determined by the method according to the first aspect, and calculating a location of the receiving unit based on the measured distance-dependent values and the retrieved locations of said plurality of sources.

Thus, a method is provided for determining locations of devices, which method makes use of the model that is generated as discussed above. According to an embodiment, the calculation of the location may be performed using a trilateration algorithm. According to another embodiment, the calculation may be performed using a fingerprint algorithm based on the model. According to yet another embodiment, the calculation may be performed using a combination of such algorithms.

BRIEF DESCRIPTION OF THE DRAWINGS

These and other aspects of the described technology will now be described in further detail, with reference to the appended drawings showing embodiment(s).

DETAILED DESCRIPTION OF CERTAIN INVENTIVE EMBODIMENTS

Figure 1:
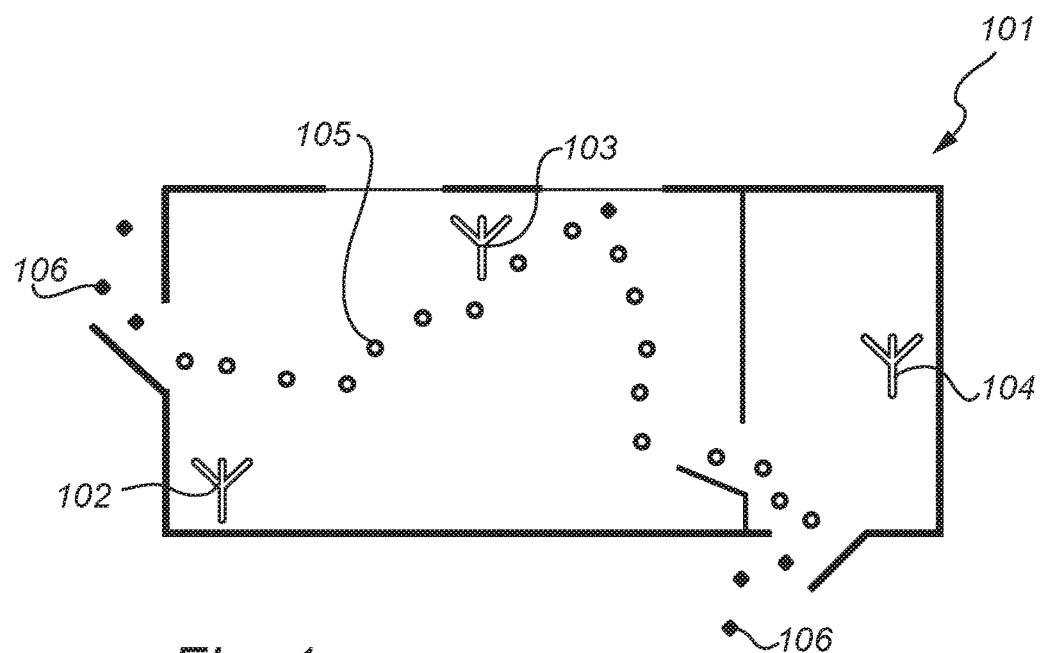
FIG. 1 is a schematic view of an indoor environment comprising sources and receiving unit positions.

There are a number of alternative technologies that may be used for positioning in indoor positioning systems (IPS) such as infrared (IR) radiation, ultrasound, radio-frequency identification (RFID), wireless local area network (WLAN), e.g. Wi-Fi, Bluetooth, sensor networks, ultra-wideband (UWB), magnetic signals, vision analysis and audible sound. Each developed system takes advantage of a particular positioning technology or combining some of these technologies, which also inherits the limitations of these technologies. The designers make tradeoff between the overall performance and the complexity of the IPSs.

Another indoor location technique is based on sensors, like compass, accelerometer and gyrator, and using these for pedestrian dead reckoning (PDR) where the relative position from an absolute position based on GPS or other is estimated. The main problem with these systems is drift due to sensor inaccuracies. To overcome drift, these systems are used in hybrid positioning setup, where it is combined with some radio frequency (RF) positioning technique, such as Wi-Fi positioning. Using these system also requires devices with many sensors and computing power, so it can mainly be used only by smart phones with special software (app or embedded) and consumes a lot of power. It is not practical to use continuously or in small inexpensive devices.

One localization technique used for positioning with wireless access points (APs) is called fingerprinting and is based on an offline learning training phase of measuring the intensity of the received signal strength (RSS) in different defined positions and record the "fingerprint" of RSS signals at that position in a database. When data is gathered in all positions, a device can look-up its position by recording the RSS "fingerprint" and compare to closest fingerprint in the database. While this method can give a good location performance, the extra effort is extensive in the pre-deployment phase to build detailed RF maps and survey the building. Also since moving a single wireless access point requires a new survey and a new RF map, this approach make it not practical more than for a few commercial buildings like shopping malls, airports etc.

Another Wi-Fi localization approach is to use the RF indoor propagation model. A received signal strength from a transmitter may be modeled using a log-distance path loss model, which in a simplified form can be expressed as:

$$Prx(dBm)=Ptx(dBm@1\ m)-10*\gamma*\log 10(d)-Pf(n)-N(s)$$

where

Prx(dBm) is the received signal power,

Ptx(dBm@1 m) is the transmit power measured by the receiver at 1 m distance from the transmitter, γ is the average RF damping factor, normally 2 for free space and between 1.5 and 6 for an indoor environment, d is the distance between transmitter and receiver in meters Pf(n) is an optional floor penetration loss factor n is number of floors between transmitter and receiver, and N is the random Gaussian noise with 0 mean and a standard deviation s.

This localization approach requires that the location of all APs are known. Preferably the exact location of the APs is determined by some manual survey of the building. Then if an electronic device measures the RSS signals of the APs, the position can be calculated by using the APs' location, indoor propagation models and trilateration algorithms. This technique requires knowledge of the APs' location and the propagation constants of the building like RF damping factor and floor penetration loss factor. Even knowing these factors, it is challenging to get an accurate location due to walls and high noise in the RSS signals due to reflections.

An alternative method to overcome these problems is to use time of flight measurements of signals between the transmitter and the receiver, also called round trip time (RTT) and fine timing measurements as being currently specified in new 802.11mc standard. Using time measurements of the time of flight for a transmission between transmitter and receiver allows a much more accurate distance estimate between an AP and an electronic device to be calculated independent of walls. Then if knowing these distance estimates for an indoor positioning system, it is a trilateration calculation assuming all APs' locations are known.

Looking at most of the current indoor positioning techniques based on RF (Wi-Fi, Bluetooth, etc.), they require a good knowledge of the location of the transmitters and some model of the RF environment in the building (fingerprints or propagation model). For improvement of positioning techniques, in particular for indoor environments, it would therefore be of interest to provide an indoor location system that does not need pre-deployment or surveying and which may continuously improve the accuracy of the APs' location and the RF model of the environment.

In U.S. Pat. No. 8,077,090, a simultaneous localization and RF modeling technique is disclosed, Mobile devices record RSS measurements corresponding to APs at various unknown locations and report these RSS measurements as well as any other location fix to a localization server. A RF modeling algorithm runs on the server and is used to estimate the location of the APs using the recorded RSS measurements and any other available location information. The method of U.S. Pat. No. 8,077,090 thus improves on techniques requiring pre-deployment or surveying of the environment. In certain embodiments, it would be desirable to provide a more robust method of creating an RF model.

In cooperation with attached drawings, the technical contents and detailed description of the described technology are described thereinafter according to a preferable embodiment, being not used to limit the claimed scope. The described technology may be embodied in many different forms and should not be construed as limited to the embodiments set forth herein; rather, these embodiments are provided for thoroughness and completeness, and fully convey the scope of the described technology to the skilled person.

Reference will now be made to the drawings to describe the described technology in detail.

In a first embodiment shown in FIG. 1, there is a single plane, 2D environment 101 with sources in the form of RF transmitters 102-104. The environment 101 is here assumed to be mostly indoor, but could be outdoor or indoor or a combination of the two. There are one or more receiving units in the form of electronic devices that measure received signal strength (RSS) from each of the transmitters 102-104 in at least same number of measurement positions 105 as the number of transmitters.

A plurality of geographic positions 106 is also provided. If two geographic positions 106 are provided, a scale of the environment in relation to an outer reference may be determined. Preferably, at least 3 of the measurement positions 105 have a reference location obtained by GPS or some other mean. For a good location result, at least 2 of these has to be accurate, the third could be of low accuracy as obtained for example by a GPS indoors below a roof window.

Figure 3:
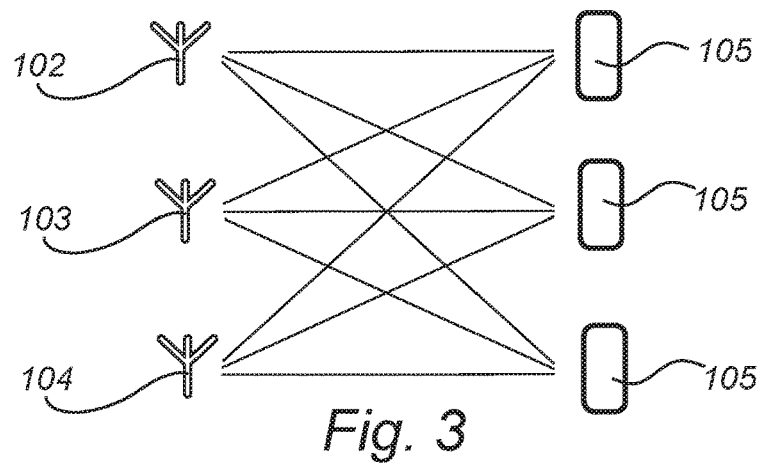
FIG. 3 is a schematic view illustrating relationship between sources and receiving units.

Assuming the measurement positions 105 and transmitters 102-104 are strongly coupled, i.e. each measurement position 105 holds information of RSS for each transmitter 102-104, as shown in FIG. 3, and the geographic position for at least 3 measurement positions 105 are known, it is possible to uniquely solve the location of all transmitters 102-104 and all measurement positions 105. Since the RSS measurements contain a lot of noise, a bundle optimization is used to solve the most likely position of all transmitters 102-104 and receivers/measurement positions 105. This bundle optimization keeps the reference location 106 of the measurement positions within its accuracy and optimizes the location of all others so the error or residual is minimized.

From the optimization the standard deviation (accuracy) of each transmitter 102-104 and each measurement position 105 can be calculated.

The bundle optimization may start with initial candidate positions for the measurement positions and the transmitters. Such initial candidate positions may be generated in a number of different ways, e.g. by randomly guessing or by making some kind of qualified guess.

Further, the candidate positions may jointly form a candidate model, which may be optimized. An embodiment of the candidate model may be set up based on the following assumptions.

An estimation of positions of receiving units are provided by measures of the received signal strength at a number of unknown measurements positions $m_i=(x_i,y_i)$, where i is used to denote the index of the measurement position 105. The transmitters 102-104 are also in unknown positions $w_j=(u_j, v_j)$, where j is used to denote the index of the transmitter. Received signal strength measurements $P_{ij}$ are obtained from measurement position with index i to transmitter with index j. Such measurements are obtained for a subset of all possible index pairs (i,j). This subset is denoted I and consists of all pairs (i,j) for which there exist a measurement from measurement position i to transmitter j. Let f(m,w) be a relevant model for power measurement. In one embodiment, a stochastic measurement model is used, where $P_{ij}$ is a stochastic variable with Gaussian distribution with mean f(m,w) and standard deviation σ. One possible model is to use $$f(m,w)=A-10*\gamma*\log 10(d(m,w)),$$

with $$d(m,w)=\sqrt{(m-w)^T(m-w)}$$

and with values of σ being 4 dB.

The unknown parameters may be collected in a column vector, e.g. $z=(w_1, \ldots, w_{n1}, m_1, \ldots, m_{n2})$. Assuming that all power measurement errors are independent, the maximum likelihood estimate of the parameters is found by maximizing the product of the likelihood. This is equivalent to minimizing the sum of the negative logarithm of the likelihood. Assuming noise with Gaussian distribution this becomes $$\sum_{(i,j)}^{I} (P_{i,j} - f(m_i, w_j))^2$$

This can be rephrased as $$\sum_r k^2$$

where r is a column vector containing all the residuals of type $(P_{ij}-f(m_i,w_i))$.

Thus, the estimation can be written as minimizing $|r(z)|^2$ over the unknown parameters z. It should be realized that a logarithmic, or other non-linear scale of the estimated distance values, may be used, such that the minimizing of $|r(z)|^2$ for e.g. RSS power measurements in dBm, is equivalent to minimizing logarithmic values of the model and estimated distances $|\log 10(d_{ij})-\log 10(d(m,w))|^2$.

The bundle optimization may be arranged to perform iterations, wherein a model error, as described above, of a candidate model is reduced. The model error comprises distance-dependent errors, which are based on a difference between a representation of a distance between a candidate source position and a candidate measurement position according to the candidate model, e.g. as a power-based representation in a logarithmic scale, and the corresponding distance as measured between the transmitter 102-104 and the measurement position 105. The model error further comprises geographic position errors, which are based on a difference between a candidate position and the corresponding reference location 106 as determined. Further errors may also be included based on other types of information being gathered from the environment, as will be further described below.

The model error is based on weighted combinations, for instance a weighted sum, of the contributing errors. The weights may be chosen in accordance with the accuracy or reliability of the corresponding measurements of the environment. Each model error may be weighted in accordance with a standard deviation of the input for the error. For instance, the error may be divided by the standard deviation. For instance, a GPS measurement of a geographic position may have a standard deviation of 10-20 m, whereas a manual positioning on a map may have a standard deviation of 1 m. Further, the geographic errors may also be given a generally higher weight than the distance-dependent errors, such that the geographic errors may be multiplied with a constant, e.g. 10.

The bundle optimization may be run in order to find a global minimum of the model error. The optimization problem is however difficult to solve, because there are many local optima. According to one embodiment, several different strategies for finding a good starting point may therefore be tried and then non-linear optimization techniques may be used for finding the closest local minima.

There are several possible strategies for finding a good initial estimate. Here we present three possible strategies.
1. Initialize z randomly
2. Initialize such measurement positions for which there is an alternative localization method, e.g. using GPS. Then use trilateration methods to obtain initial estimates of the remaining parameters if possible. For those that cannot be calculated, initialize them randomly.
3. Use minimal solvers and random sampling consensus to obtain initial estimates of the parameters.

The random sampling consensus paradigm is based on randomly selecting a minimal subset of the data, that still allows for estimation of the parameters. For each such subset one solves for the unknown parameters. There are several solutions to this sub-problem. Nevertheless each solution associated with each subset can then be verified with remaining data. This makes it possible to both remove outliers and also to obtain high-quality initial estimates to the parameters, to be used in subsequent non-linear optimization.

For the case of measurement positions and transmitters in two dimensions, the minimal configuration is 3 measurement positions and 3 transmitters. These give rise to 9 power measurements. For each set of 9 power measurements there are 8 possible solutions. Algorithms for calculating all solutions from the power measurements in an efficient and numerically stable manner may be created as described above.

In another embodiment, the transmitters 102-104 in above description can be a combination of different types, for example a combination of Wi-Fi APs and Bluetooth low energy (BLE) beacons.

Figure 2:
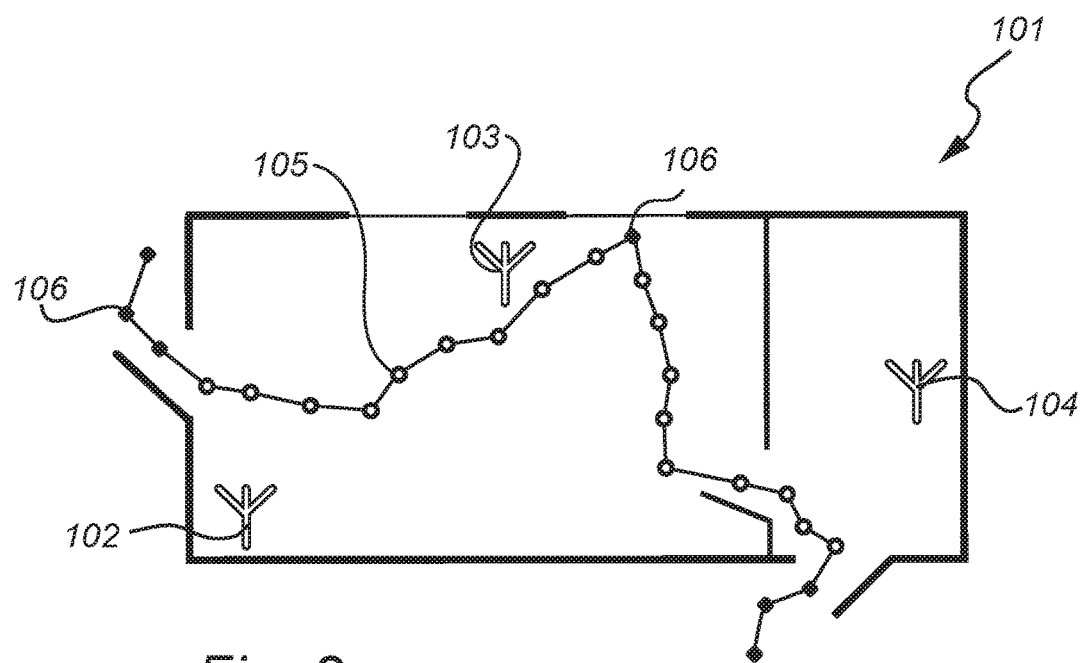
FIG. 2 is a schematic view similar to FIG. 1, wherein the receiving unit positions are indicated as a track along which a mobile device has been moved through the environment.

In another embodiment, all or some of the measurements are made as a track, see FIG. 2. Thus the same electronic device has made multiple measurements at regular intervals that are not too far apart to be uncorrelated. The bundle optimization then also includes the assumption that the speed and/or direction is constant between points, and adds a residual for any deviation from this assumption. There are a number of ways to implement this residual, for example using the time stamp between three points and assume that the middle point should always be on the line between the outer points. The weighting of this residual compared to the other residual is important. A too high weight on the track means that the measurement positions may be forced to a straight line or equidistantly spaced positions, a too low weight will mean that the track will not impact the measurement positions 105.

In another embodiment, the model is optimized using an average RF damping factor for the indoor environment. It is a well-known problem that different buildings have very different RF propagation properties. A building with only thin walls or glass walls have a low damping factor and a building with many thick concrete walls have a high damping factor. Assuming the building structure is somewhat uniform, an average RF damping factor gives a much better result for the optimizations than using a fixed RF damping factor given by International Telecommunication Union (ITU) models or similar estimate.

In yet another embodiment, the model is optimized using a RF damping factor individually for each transmitter 102-104. Thus, for transmitters 102-104 located in corridors, the damping factor within the corridor is close to 2 or even below 2. For a transmitter 102-104 behind many walls, the damping factor could be as high as 5-6. This means that for each transmitter 102-104, the model is optimized not just for location x and y for lowest residual, but also damping factor γ. It is understood that more measurement data is now needed for the optimization since there are 3 unknowns for each transmitter 102-104: x, y and γ.

Similarly, in another embodiment, the model may be optimized for the transmitter output power at one meter for each transmitter 102-104. In some embodiments, this value should not differ very much between Wi-Fi APs since e.g. Wi-Fi APs for use in the 2.4 GHz band normally have specified output power (100 mW). However, there are APs that allow transmit power regulation and the transmitter 102-104 can be placed unfavorably, for example behind a wall. Also, Wi-Fi APs for use in the 5 GHz band, may often have differing output powers, e.g. varying between 50 mW and 1 W. Even more measurement data is now needed since there are 4 unknown parameters optimized for each transmitter 102-104 $x$, $y$, $\gamma$ and Ptx(@1 m).

In another embodiment, timing measurements of RF signals, often called RTT or fine timing measurement, are used instead of RSS measurements. The RF signals travels at the speed of light ($3*10^8$ m/s) and tests with Wi-Fi APs according to new 802.11mc specification shows a measurement accuracy down to 1 ns. This means a theoretical spatial resolution of 0.3 m. However, reflections and 2.4 GHz resonance with water make resolution around 1 m. Still, RTT measurements results in a much more accurate estimate of distance between transmitter 102-104 and receiver and low dependency of walls and floors obstruction.

In another embodiment, a combination of RSS and RTT measurements is used to estimate all transmitters 102-104 and measurement positions 105. Since probably not all APs and devices will support RTT in the future, this is a likely situation. RTT measurements are used in the optimization with a higher weight than just RSS measurements. Since the standard deviation is smaller for RTT, the location result of the optimization will be based on RTT primarily and with RSS as supporting information.

In yet another embodiment, all the above mentioned embodiments for RSS are used for 3D modeling with the z-axis (height) values just being allowed in discrete steps (floors). The optimization is made as an iterative 2D optimization for measurement positions and APs for each floor. A floor attenuation factor for APs seen by measurement positions 105 on adjacent floors has to be added in the optimization. To get a good starting value of which measurement position 105 and which AP is on which floor, a cluster algorithm or any other initialization may be applied. Also, other sensors, such as a pressure sensor, could give a good starting value, or a final value, for the floor of the measurement positions. The iterative optimization of the model error could be constrained to allow or not allow movement of measurement positions between floors.

In another embodiment, a full 3D model is created by the measurements. Thus for each AP and each measurement position 105, the x, y and z are estimated. For a full 3D model optimization, the noise in RSS measurements may be too high, so RTT measurements are preferably used. Many RTT measurements or similar timing measurements are necessary, since a much higher accuracy is required to get a good enough model. At least 3 known measurement positions providing geographic position information are required, of which 2 has to be on same floor.

If there are a lot of data (APs and/or measurement positions 105 for a building, the optimization calculation is quite expensive in terms of computational power. In another embodiment, the results from the optimizations are stored in a memory for later use. For a new location request of a measurement position 105, the location calculation is made by a simple trilateration algorithms and the stored position of the APs. This computation is very simple and can be made either on the location server or in the device itself assuming it knows the surrounding APs.

In another embodiment, the location calculation for a new location request of a new measurement position is made by using fingerprinting algorithms and the stored position of the measurement positions 105.

In yet another embodiment, the location calculation for a new measurement position is made by taking the average of the trilateration location based on APs and the fingerprint location based on measurement positions 105.

It is possible to improve a RSS-based model if there are RTT measurements available. In an embodiment, an RF model or heat map of RSS measurements is created using measurement positions 105 generated from RTT measurements. In this case the RSS measurements are not used directly for generating the measurement positions 105 but mapped on the environment. Thus RTT measurements are being used for calculating the APs location and RSS measurements are being used to model the RF properties of the building better. Both average building damping factor, floor attenuation factor and each APs damping factor can be estimated and used for better positioning.

In another embodiment using the improved RSS model it is even possible to estimate the location of walls and their RF properties. For example, if the average received power from an AP at a certain measurement position 105 is X and the average received power at another measurement position 105 1 m further from the AP is X-10 dB, it can be derived there is a wall between them with a wall attenuation factor close to 10 dB.

In another embodiment, the improved RSS model is used with RF heat maps from each AP to do a positioning of a simple device that can only scan RSS from APs. The most likely position is calculated by using trilateration of likely positions from each AP.

In another embodiment, the improved RSS model is used for generating fingerprints of each measurement position 105 and for positioning of a simple device by using fingerprinting algorithms for finding most likely position.

In yet another embodiment, RTT measurements are used together with track data to generate a map of possible paths in the building. Since it is possible to calculate each location with enough good accuracy with RTT, all possible paths walking around in the building can be stored. If there are enough paths stored, it is possible to overlay all these data to find and map building structures such as doors, halls, stairs, elevators, etc.

Figure 4:
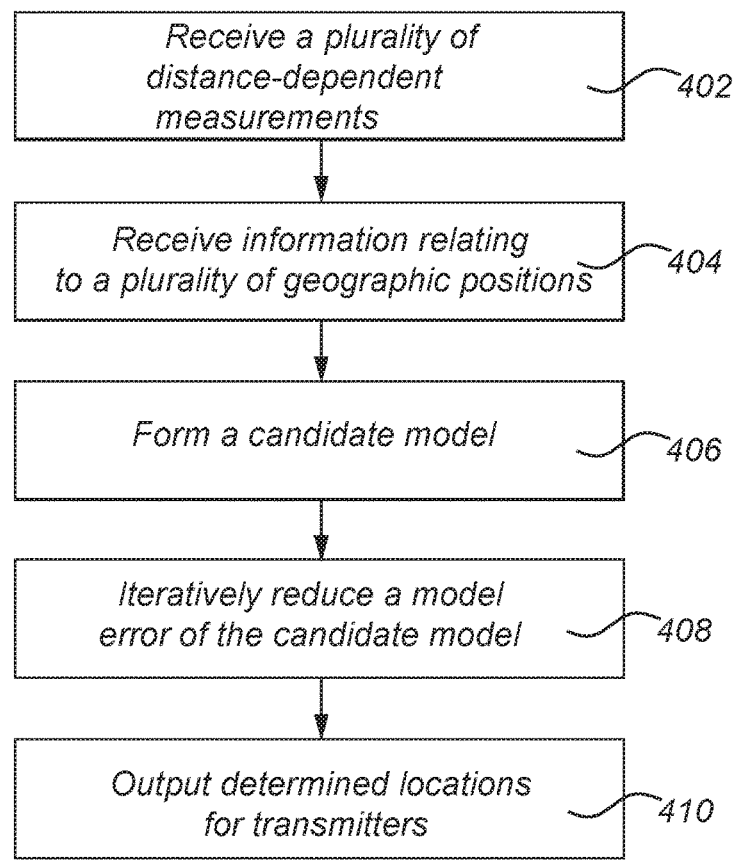
FIG. 4 is a flow chart illustrating a method for generating a model of an environment according to an embodiment.

Referring now to FIG. 4, a method for generating a model of an environment will be described. The method may be performed in a server or any type of powerful computing resource. The server receives a plurality of distance-dependent measurements, step 402, such as RSS or RTT, providing information relating to a distance between a measurement position and a transmitter. The server also receives information relating to a plurality of geographic positions, step 404, which may provide a reference location for a measurement position or a transmitter.

The server may then form a candidate model, step 406, defining candidate source positions for the transmitters and candidate receiving unit positions for the measurement positions.

Then, a model error of the candidate model is iteratively reduced, step 408, in order to find a best combination of positions of the transmitters and the measurement positions. Finally, the determined locations for the transmitters may be output, 410 to form the model of the environment.

The model may be stored in the server to provide a possibility to determine locations of devices as new measurements are received from receiving units in the environment. Alternatively, the model may be downloaded to clients, e.g. the receiving units, in order to provide a possibility to perform localization locally in the device. The receiving unit may detect when a new environment is entered and may then download the corresponding model in order to perform localization in the new environment.

Figure 5:
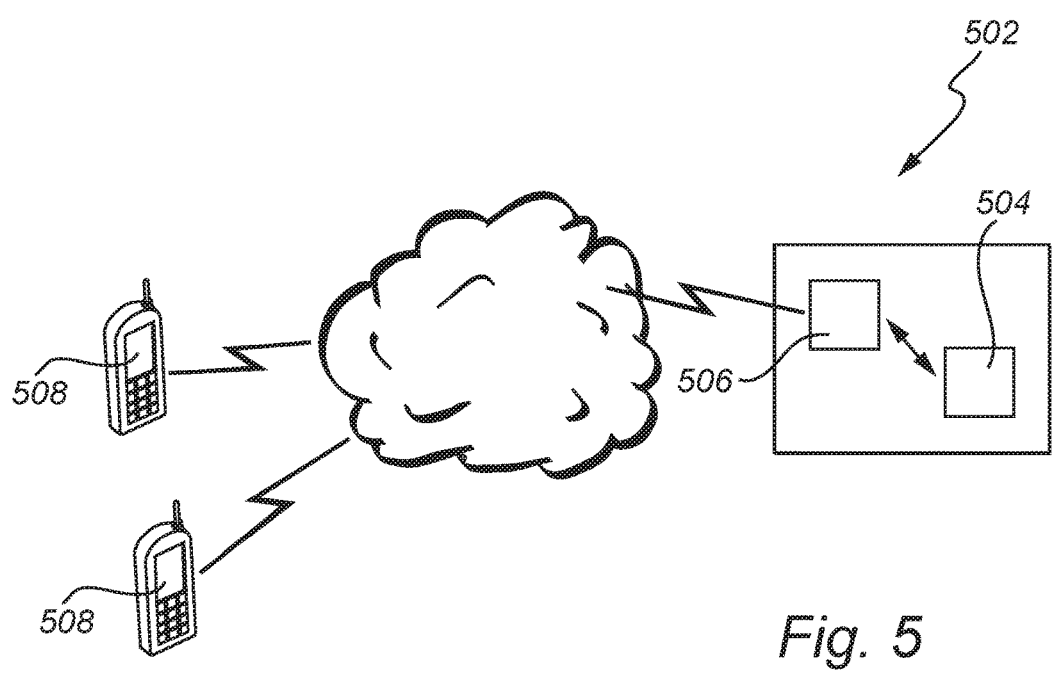
FIG. 5 is a schematic view of a system for generating a model of an environment according to an embodiment.

Referring now to FIG. 5, a system 500 for generating a model of an environment will be described. The system 500 comprises a computer resource 502 having a processing unit 504 for performing computations in order to generate the model. The processing unit 504 may be provided with a computer program controlling the processing unit 504, such as a central processing unit (CPU), a graphics processing unit (GPU), to generate the model. In an alternative, an application-specific integrated circuit (ASIC) or field-programmable gate array (FPGA) may be arranged to control the generation of the model.

The computer resource 502 further comprises a communication unit 506 for receiving information from receiving units 508, which measure distance-dependent values to transmitters. The communication unit 506 may also be arranged to receive information relating to geographic positions, such as reference locations for measurement positions of the receiving units. The communication unit 506 may be arranged to transfer the received information to the processing unit 504 as input for generating the model.

When the processing unit 504 has generated the model, it may be stored in the computer resource 502 in order to allow determination of locations based on the model by means of the computer resource 502. The generated model may also, or alternatively, be downloaded to receiving units 508 in order to allow determination of locations of the receiving units 508 within the receiving units 508 themselves.

Information and signals disclosed herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative logical blocks, and algorithm steps described in connection with the embodiments disclosed herein may be implemented as electronic hardware, computer software, or combinations of both. To clearly illustrate this interchangeability of hardware and software, various illustrative components, blocks, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The techniques described herein may be implemented in hardware, software, firmware, or any combination thereof. Such techniques may be implemented in any of a variety of devices such as general purposes computers, wireless communication device handsets, or integrated circuit devices having multiple uses including applications in wireless communication device handsets, automotive, appliances, wearables, and/or other devices. Any features described as devices or components may be implemented together in an integrated logic device or separately as discrete but interoperable logic devices. If implemented in software, the techniques may be realized at least in part by a computer-readable data storage medium comprising program code including instructions that, when executed, performs one or more of the methods described above. The computer-readable data storage medium may form part of a computer program product, which may include packaging materials. The computer-readable medium may comprise memory or data storage media, such as random access memory (RAM) such as synchronous dynamic random access memory (SDRAM), read-only memory (ROM), non-volatile random access memory (NVRAM), electrically erasable programmable read-only memory (EEPROM), FLASH memory, magnetic or optical data storage media, and the like. The techniques additionally, or alternatively, may be realized at least in part by a computer-readable communication medium that carries or communicates program code in the form of instructions or data structures and that can be accessed, read, and/or executed by a computer, such as propagated signals or waves.

The program code may be executed by a processor, which may include one or more processors, such as one or more digital signal processors (DSPs), general purpose microprocessors, an application specific integrated circuits (ASICs), field programmable logic arrays (FPGAs), or other equivalent integrated or discrete logic circuitry. Such a processor may be configured to perform any of the techniques described in this disclosure. A general purpose processor may be a microprocessor; but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Accordingly, the term "processor," as used herein may refer to any of the foregoing structure, any combination of the foregoing structure, or any other structure or apparatus suitable for implementation of the techniques described herein. In addition, in some aspects, the functionality described herein may be provided within dedicated software or hardware configured for encoding and decoding, or incorporated in a combined video encoder-decoder (CODEC). Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, or units are described in this disclosure to emphasize functional aspects of devices configured to perform the disclosed techniques, but do not necessarily require realization by different hardware units. Rather, as described above, various units may be combined in a codec hardware unit or provided by a collection of inter-operative hardware units, including one or more processors as described above, in conjunction with suitable software and/or firmware.

Although the foregoing has been described in connection with various different embodiments, features or elements from one embodiment may be combined with other embodiments without departing from the teachings of this disclosure. However, the combinations of features between the respective embodiments are not necessarily limited thereto. Various embodiments of the disclosure have been described. These and other embodiments are within the scope of the following claims.

The person skilled in the art realizes that the inventive technology by no means is limited to the preferred embodiments described above. On the contrary, many modifications and variations are possible within the scope of the appended claims.

What is claimed is:

1. A method for determining a location of a device, said method comprising:
    receiving first power-based distance measurements, each measurement representing a distance from the device to a source as a measured power of a signal received by the device;
    accessing a model defining source locations and radio frequency propagation properties in an environment, said source locations and radio frequency propagation properties being determined based on a collection of second power-based distance measurements representing a distance from receiving units to source locations and at least one of: time-based distance measurements representing a distance from receiving units to source locations, sequential receiving unit positions, compass data, accelerometer data, gyrator data, sensor data indicating a relative floor in a building, and data correlating measurements at regular intervals, wherein said second power-based distance measurements are acquired prior to acquiring of the first power-based distance measurements and said receiving units are different from the device; and determining a location of the device based on the first power-based distance measurements and the source locations, which are based on the second power-based distance measurements, and the radio frequency propagation properties defined by the model, wherein the model represents an indoor environment of a multi-floor building, the method further comprising determining a location of the device in the multi-floor building, the location including at least a floor indication and a position on the floor, based on the received first power-based distance measurements and the model.

2. The method according to claim 1, wherein the model represents a 2.5-dimensional environment.

3. The method according to claim 1, wherein the floor sensor value is received from a pressure sensor.

4. The method according to claim 1, further comprising the device downloading the model from a server.

5. The method according to claim 1, wherein the model defines radio frequency propagation properties using an average building damping factor.

6. The method according to claim 1, wherein the model defines radio frequency propagation properties including location of walls and radio frequency propagation properties of the walls.

7. The method according to claim 1, wherein the determining of the location comprises calculating the location using trilateration of likely positions from each source.

8. The method according to claim 1, wherein the determining of the location comprises using fingerprinting algorithms based on the model for finding likely position of the device.

9. The method according to claim 1, wherein the device is a Wi-Fi receiver or Bluetooth receiver or a cellular receiver and sources are Wi-Fi access points or Bluetooth beacons or cellular base stations, for example Long-Term Evolution pico base stations.

10. The method according to claim 1, wherein a sequence of first power-based distance measurements is received, the determining of the location of the device being based on bundle optimization of the sequence of first power-based distance measurements in relation to the model.

11. The method according to claim 10, wherein the bundle optimization includes an assumption of speed and/or direction between points in the sequence.

12. The method according to claim 10, wherein the model is used as an initial estimate for the bundle optimization.

13. The method according to claim 10, further comprising forming a track of sequence of positions of the device, wherein the bundle optimization is used for locating the device in the sequence of positions along the track based on assumptions of speed and/or direction between points in the sequence as a residual to the bundle optimization in locating the device along the track.

14. The method according to claim 13, wherein determining the location of the device in the sequence of positions comprises forming a model by a previous bundle optimization as an initial estimate of the model for determining the location of the device, and forming another bundle optimization using the first power-based distance measurement positions in the sequence of positions to update the initial estimate of the model and determine location of the device based on the first power-based distance measurement positions.

15. An apparatus for determining a location of a device; said apparatus comprising:

a storage unit configured to receive and store first power-based distance measurements, each measurement representing a distance from the device to a source as a measured power of a signal received by the device; and a processing unit configured to:

access a model defining source locations and radio frequency propagation properties in an environment, said source locations and radio frequency propagation properties being determined based on a collection of second power-based distance measurements representing a distance from receiving units to source locations and at least one of: time-based distance measurements representing a distance from receiving units to source locations, sequential receiving unit positions, compass data, accelerometer data, gyrator data, sensor data indicating a relative floor in a building, and data correlating measurements at regular intervals, wherein said second power-based distance measurements are acquired prior to acquiring of the first power-based distance measurements and said receiving units are different from the device; and determine a location of the device based on the received power-based distance measurements and the source locations, which are based on the second power-based distance measurements, and the radio frequency propagation properties defined by the model, wherein the model represents an indoor environment of a multi-floor building, the processing unit further configured to determine a location of the device in the multi-floor building, the location including at least a floor indication and a position on the floor, based on the received first power-based distance measurements and the model.

16. The apparatus according to claim 15, wherein fingerprinting algorithms based on the model for finding likely position of the device are used to determine the location of the device.

17. The apparatus according to claim 15, wherein the device is a Wi-Fi receiver or Bluetooth receiver or a cellular receiver and sources are Wi-Fi access points or Bluetooth beacons or cellular base stations, for example Long-Term Evolution pico base stations.

18. The apparatus according to claim 15, wherein the first power-based distance measurements comprise a sequence of first power-based distance measurements, and wherein the processing unit determines the location of the device based on bundle optimization of the sequence of first power-based distance measurements in relation to the model.

* * * * *